United States Patent
Kawata

(10) Patent No.: US 7,030,802 B2
(45) Date of Patent: Apr. 18, 2006

(54) AD CONVERTER

(75) Inventor: Tsuyoshi Kawata, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/981,908

(22) Filed: Nov. 5, 2004

(65) Prior Publication Data

US 2005/0099329 A1    May 12, 2005

(30) Foreign Application Priority Data

Nov. 7, 2003    (JP)    ............... 2003-378620

(51) Int. Cl.
*H03M 1/12* (2006.01)
(52) U.S. Cl. ..................... 341/155; 341/158
(58) Field of Classification Search ................ 341/118, 341/122, 155, 156, 158, 159; 327/91, 94, 327/95
See application file for complete search history.

(56) References Cited

U.S. PATENT DOCUMENTS 5,734,342 A *   3/1998   Mes ........................ 341/159
6,504,499 B1 *  1/2003   Masenas et al. .......... 341/155

FOREIGN PATENT DOCUMENTS

JP    06-120828    4/1994

* cited by examiner

*Primary Examiner*—Brian Young
(74) *Attorney, Agent, or Firm*—SoCal IP Law Group LLP

(57) ABSTRACT

An AD converter having a series resistor arranged to generate at each of connection points a reference voltage to convert an analog value to a digital value, and semiconductor switches each constituted by a parallel combination of a PMOSFET and an NMOSFET and disposed one for each of the connection points, the AD converter, while applying a first voltage to a first gate electrode of the PMOSFET to bring the PMOSFET into conduction and a second voltage higher than the first voltage to a second gate electrode of the NMOSFET to bring the NMOSFET into conduction, generating the digital value on the basis of results of comparing the analog value with the reference voltages output from the semiconductor switches, comprises a control circuit operable at least either to step down the first voltage applied to the first gate electrode or to step up the second voltage applied to the second gate electrode.

8 Claims, 4 Drawing Sheets

AD CONVERTER

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

This patent application claims priority upon Japanese Patent Application No. 2003-378620 filed on Nov. 7, 2003, which is herein incorporated by reference.

BACKGROUND OF THE INVENTION

1. Field of the Invention

The invention relates to an AD converter.

2. Description of the Related Art

AD converters are available, for example, of successive and batch comparison types and can be further classified into a type using an integrator, that using a series resistor (generally referred to as "ladder resistor") and so on. Brief description will be given below of an AD converter using a series resistor.

The AD converter has a series resistor made up of $2^m$ resistors (^ means "to the power of") according to the resolution (e.g., m bits) of the converter. The series resistor is connected to a supply voltage VDD at one end and a ground voltage GND at the other end. A transfer gate (alternatively referred to as "transmission gate"; hereinafter referred to as "TG"), a gate made up of a parallel combination of a PMOSFET and an NMOSFET, is connected to each of connection points of the resistors making up the series resistor.

The TG functions as a so-called CMOS analog switch, which outputs the analog voltage of the connection point of the series resistor connected to the TG when both the PMOSFET and NMOSFET are brought into conduction as a result of application of voltages of the same level but opposite in polarity to the respective gate electrodes of the PMOSFET and NMOSFET.

The AD converter controls conduction/nonconduction of the TG and further converts, based on the result of comparison of the analog voltage (reference voltage) at a connection point of the series resistor output by the conducting TG and an analog value subject to be converted to a digital value, the analog value to a digital value. Refer to, e.g., Japanese Patent Application Laid-open Publication No. H06-120828.

Recent years have seen an accelerated transition to lower operating voltages in the semiconductor integrated circuits, and design and development efforts are underway to enable the AD converters and the TGs thereof to operate at low voltages. However, low-voltage operation of the TG causes the TG conduction current flow to become smaller, resulting in a problem of increased TG ON impedance. Further, due to the time constant, i.e., the product of the increased TG ON impedance and the wiring capacitance, the waveform of the reference voltage selected from the connection points of the series resistor becomes slow in transition, possibly degrading the AD conversion accuracy as a result of an erroneous comparison with the analog value before the reference voltage is fixed.

The problem of the reference voltage waveform being slow becomes particularly prominent when one half the supply voltage VDD (hereinafter referred to as "½VDD") is selected as the reference voltage, that is, when gate-to-source voltages Vgs of both the PMOSFET and NMOSFET are in the vicinity of ½VDD.

SUMMARY OF THE INVENTION

In light of the foregoing, it is an object of the invention to provide an AD converter with an improved AD conversion accuracy.

In order to achieve the above object, according to a major aspect of the invention there is provided an AD converter having a series resistor arranged to generate at each of connection points a reference voltage to convert an analog value to a digital value, and semiconductor switches each constituted by a parallel combination of a PMOSFET and an NMOSFET and disposed one for each of the connection points. The AD converter, while applying a first voltage to a first gate electrode of the PMOSFET to bring the PMOSFET into conduction and a second voltage higher than the first voltage to a second gate electrode of the NMOSFET to bring the NMOSFET into conduction, generates the digital value on the basis of results of comparing the analog value with the reference voltages output from the semiconductor switches. The AD converter comprises a control circuit operable at least either to step down the first voltage applied to the first gate electrode or to step up the second voltage applied to the second gate electrode.

DESCRIPTION OF THE DRAWINGS

The above and other objects, aspects, features and advantages of the invention will become more apparent from the following detailed description when taken in conjunction with the accompanying drawings, in which.

DETAILED DESCRIPTION OF THE INVENTION

Throughout this description, the embodiments and examples shown should be considered as exemplars, rather than limitations on the apparatus and methods of the invention.

A. AD Converter Configuration

Description will be given of an AD converter according to an embodiment of the present invention with reference to FIG. 1. It is to be noted that we assume that, in the present embodiment described below, the AD converter is a successive-comparison-type AD converter that converts an analog voltage VA to an eight-bit digital value (D7 to D0).

Figure 1:
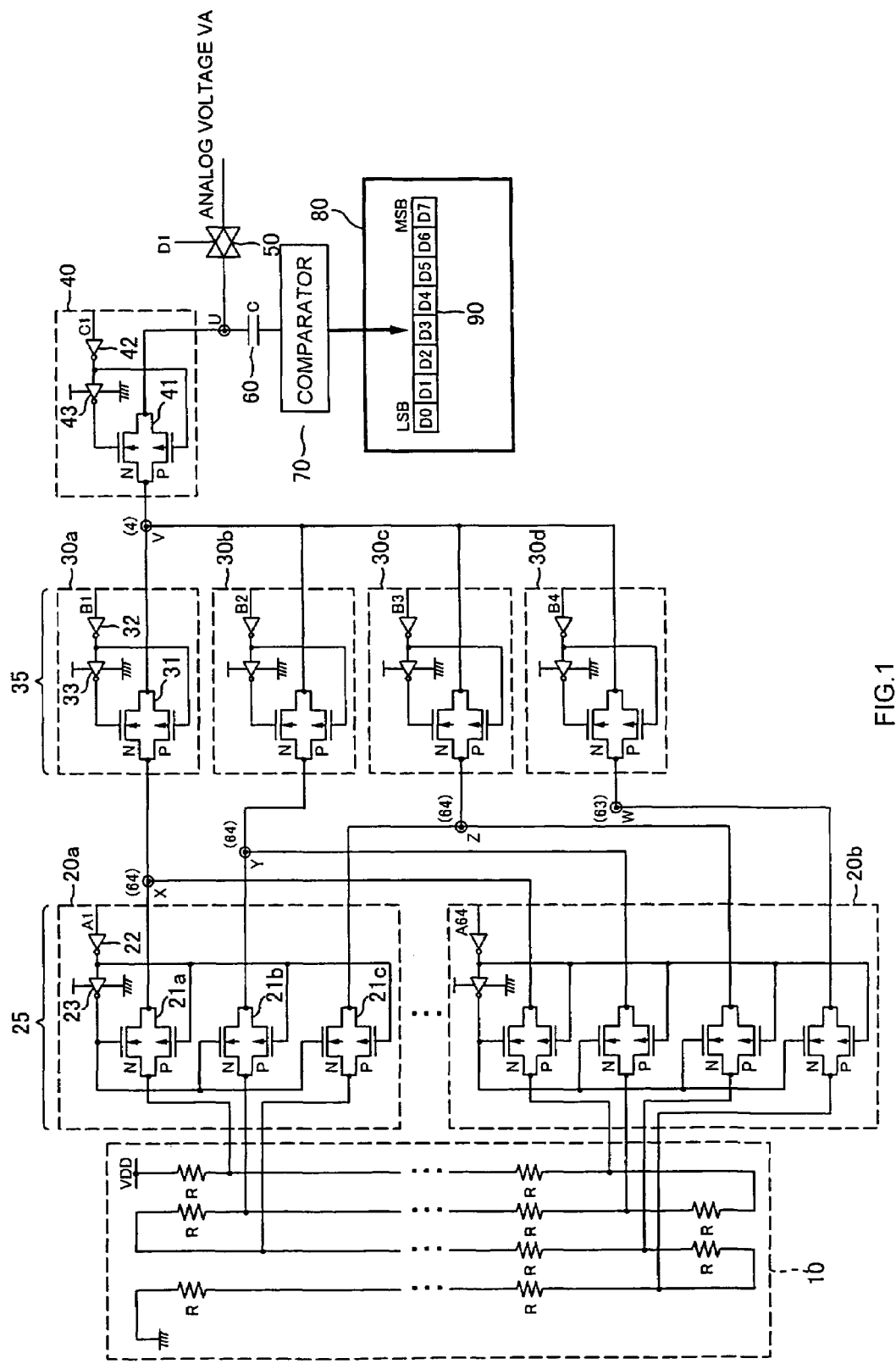
FIG. 1 is a view showing a configuration of an AD converter according to an embodiment of the invention.

In FIG. 1, the successive-comparison-type AD converter has a series resistor 10, a first switch cluster 25, a second switch cluster 35, analog switches 40 and 50, a capacitive element 60, a comparator 70 and an encoder 80.

The series resistor 10, connected to a supply voltage VDD at one terminal and ground potential GND at the other terminal, is designed to generate a reference voltage—a voltage to be compared with the analog voltage VA in the comparator 70 that will be described later—at each of the connection points. Since in the present embodiment, the successive-comparison-type AD converter has an eight-bit resolution, the series resistor 10 is made up of 256 (=2^8) resistors, each having a resistance R, connected in series between the supply voltage VDD and the ground potential GND and generates divided voltages at 255 (=2^8−1) connection points as reference voltages.

Incidentally, as the number of resistors possessed by the series resistor 10 increases in a power-law manner according to the resolution of the successive-comparison-type AD converter, arranging the series resistor 10 longitudinally becomes practically difficult. For this reason, the series resistor 10 is preferably folded back a predetermined number of times (three times in the example shown in FIG. 1) and arranged as shown in FIG. 1. Folding back and arranging the series resistor 10 condenses it into a smaller arrangement area and facilitates the arrangement of other circuit elements. Further, this arrangement makes it less likely to cause variations in voltage division ratio due to etching error on both ends, as compared with the longitudinal arrangement of the series resistor 10.

The first switch cluster 25 is an assembly of transfer gates (hereinafter referred to as TGs; "first semiconductor switches") 21 provided in a one-to-one correspondence with the connection points of the series resistor 10. The first switch cluster 25 is divided into groups, each consisting of TGs 21 to be controlled into conduction or nonconduction together on the basis of a same control voltage A, thus facilitating the arrangement of circuit elements by reducing the number of the control voltages A for selecting TGs 21. That is, groups 20 correspond to the control voltages A respectively, and letting the number of the control voltages A be n, n number of groups 20 exist.

In the present embodiment, we assume that the number of the control voltages A (A1 to A64) is 64, and the first switch cluster 25 has a total of 64 of groups 20, including a group 20a containing three TGs (21a, 21b, 21c) that are together controlled into conduction/nonconduction based on a control voltage A1 and a group 20b containing four TGs 21 that are together controlled into conduction/nonconduction based on a control voltage A64.

Here, a description will be given in further detail of the configuration of each of the groups 20 of the first switch cluster 25, taking the group 20a associated with the control voltage A1 as an example. It is to be noted that we assume herein that when the level of the control voltage A is at a logic value of "0", the TGs (21a, 21b, 21c) are conductive, whereas when the level of the control voltage A is at a logic value of "1", the TGs (21a, 21b, 21c) are non-conductive.

The group 20a is made up of the three TGs (21a, 21b, 21c) that are together controlled into conduction/nonconduction based on the control voltage A1, and inverters 22 and 23.

The TGs (21a, 21b, 21c) are each constituted by a parallel combination of a PMOSFET ("P-type switching element") and an NMOSFET ("N-type switching element"). Applied to the inverter 22 is the control voltage A supplied from the encoder 80 that will be described later, and its output, an inverted signal in logic level, is applied to the inverter 23 and to the gate electrodes ("first gate electrodes") of the PMOS-FETs of the TGs (21a, 21b, 21c). The inverter 23 having the output of the inverter 22 applied thereto inverts the inverted signal, and its output, a voltage indicating the same logic value as the control voltage A, is applied to the gate electrodes ("second gate electrodes") of the NMOSFETs of the TGs (21a, 21b, 21c).

That is, the inverters 22 and 23 function as a control circuit for applying the control voltages, inverted in logic level from each other, to the gate electrodes of the PMOS-FETs and NMOSFETs, in order to bring the PMOSFETs and NMOSFETs of the TGs (21a, 21b, 21c) into conduction or nonconduction together.

The second switch cluster 35 has as many analog switches (30a, 30b, 30c, 30d) as the largest number among the numbers of the TGs 21 possessed by the groups 20 of the first switch cluster 25. Since in the present embodiment, all the groups 20 have the four TGs 21 except for the group 20a that has the three TGs (21a, 21b, 21c), the largest number of the numbers of the TGs possessed by the groups 20 of the first switch cluster 25 is four. Therefore, the second switch cluster 35 has four analog switches (30a, 30b, 30c, 30d), i.e., four TGs ("second semiconductor switches") 31.

The TGs 31 of the analog switches (30a, 30b, 30c, 30d) have the outputs of the TGs 21 possessed by each group 20 of the first switch cluster 25 inputted in parallel. For example, the TG 31 of the analog switch 30a receives the output of one of the TGs 21 of each group 20 of the first switch cluster 25 via a node X (see FIG. 1). In the same manner, the TG 31 of the analog switch 30b receives the output of a TG 21 different from that for the analog switch 30a of each group 20 of the first switch cluster 25 via a node Y (see FIG. 1). The same holds true with the other analog switches (30c and 30d). That is, when one of the groups 20 of the first switch cluster 25 is selected based on the control voltage A, the outputs of the TGs 21 of the selected group 20 are respectively input to the TGs 31 of the analog switches (30a, 30b, 30c, 30d) in parallel.

Furthermore, each of the analog switches (30a, 30b, 30c, 30d) has the TG 31 and inverters 32 and 33, and is similar in configuration to the analog switch (21, 22, 23) of the first switch cluster 25. Further, the analog switches (30a, 30b, 30c, 30d) are controlled into conduction/nonconduction individually on the basis of control voltages B ("second control signals") for selecting one of the TGs 31. That is, after selection of one of the groups 20 of the first switch cluster 25 based on the control voltages A, one of the outputs of the TGs 21 possessed by the selected group 20 is selected based on the control voltages B in the second switch cluster 35.

The analog switch 40 is required for a comparison processing performed by the comparator 70 using the property of the capacitive element 60 to hold the potential difference between the terminals thereof (hereinafter referred to as "chopper-type system"). The analog switch 40 has a TG 41 and inverters 42 and 43 as the analog switch (21, 22, 23) of the first switch cluster 25 and receives the output of one of the analog switches 30 in the second switch cluster selected based on the control voltages A and B. And the TG 41 is controlled into conduction/nonconduction based on a control voltage C.

The analog switch 50 is required when the chopper-type system is employed as with the analog switch 40. The analog switch 50 has a TG and first and second inverters (none shown) as with the analog switch (21, 22, 23) of the first switch cluster 25 and receives externally the analog voltage VA. And the TG (not shown) is controlled into conduction/nonconduction based on a control voltage D.

The capacitive element 60 is charged when receiving the output of the analog switch 50. When the output of the analogue switch 40 is inputted to the capacitive element 60, the output at the other terminal of the capacitive element 60 varies. During the charge and varying period, the capacitive element 60 holds a given potential difference between both its terminals on the basis of a predetermined capacitance C.

The comparator 70 is designed to perform the sequential comparisons of the analog voltage VA and the selected reference voltage according to a one-half approximation method based on the voltage level on the comparator 70 side of the capacitive element 60.

The encoder 80 sequentially generates the control voltages A, B, C and D at predetermined timings according to the one-half approximation method. The encoder 80 then sequentially determines each of the bits (D7 to D0) of the eight-bit digital value on the basis of the comparison output of the comparator 70, storing these bits in a register 90. A description will be given below in detail of the operation of the encoder 80.

First, in order to select one half the supply voltage VDD (hereinafter referred to as "½VDD") as the first reference voltage from the connection points of the series resistance 10, the encoder 80 brings a group 20 of the first switch cluster 25 and an analog switch 30 corresponding to the ½VDD into conduction using the control voltages A and B respectively.

Then, the encoder 80 brings the analog switch 50 into conduction and the analog switch 40 into nonconduction, thereby inputting the output of the analog switch 50 (analog voltage VA) to one terminal (on the analog switch 40 side) of the capacitive element 60. At this time, the voltage level at the other terminal (on the comparator 70 side) of the capacitive element 60 is held at ½VDD.

Next, the encoder 80 brings the analog switch 50 into nonconduction and the analog switch 40 into conduction, changing the potential of the one terminal (on the analog switch 40 side) of the capacitive element 60 while holding the potential difference between the one terminal of the capacitive element 60 and the other terminal (on the comparator 70 side). This causes the voltage level of the other terminal (on the comparator 70 side) of the capacitive element 60 to be at (analog voltage VA−½VDD). The encoder 80 performs the first comparison according to the one-half approximation method based on the voltage level of the other terminal (on the comparator 70 side) of the capacitive element 60.

Here, when the analog voltage VA is greater than the ½VDD, "1"—the comparison result—is held by the D7, the highest order bit of the register 90. Since it is found that the analog voltage VA is in the range of (½VDD to VDD), an intermediate voltage ¾VDD of the range of (½VDD to VDD) is set as the next reference voltage. Thereafter, the similar operation is repeated for down to the lowest order bit D0 of the register 90, thus generating an eight-bit digital value.

The above is an outline of the configuration of the successive comparison type AD converter according to the embodiment of the present invention. It is to be noted that in the aforementioned embodiment, the comparator 70 may be of a different type from the chopper type and compare the output of an analog switch 30, selected based on the control voltages A, B and the analog voltage VA in a straightforward manner. In this case, the analog switches 40 and 50 and the capacitive element 60 are no longer needed.

B. Stepping Up/Down of Voltage According to the Invention

1. Outline

As described earlier, ingenuity has been exercised on the successive comparison type AD converter to facilitate the arrangement of the circuit components, including folding back the series resistance 10 and reducing the number of the control voltages A. As a result, when a desired reference voltage is selected from the connection points of the series resistance 10 for comparison in the comparator 70, the selected reference voltage is input to the comparator 70 via at least the TGs (21, 31) and pieces of wiring from the series resistor 10 to the TG 31. In a conventional case, therefore, the waveform of the selected reference voltage is slow in transition due to the time constant given by the product of the ON impedance of the TGs (21, 31) and the capacitances of the pieces of wiring from the series resistance 10 to the TG 31, resulting in a delay in propagation to the comparator 70. Moreover, with the successive comparison type AD converter, a different reference voltage is selected and compared with the analog voltage VA as many times as the bit count of the digital value, causing an accumulated reference voltage propagation delay—a delay in generating the bits of the digital value—to manifest itself.

Further, the successive comparison type AD converter shown in FIG. 1 has not only the capacitive element 60 but also the analog switches 40 and 50 because the converter employs the chopper type system. For this reason, the reference voltage selected from the connection points of the series resistor 10 is input to the comparator 70 further via the TG 41 possessed by the analog switch 40 and the wiring from the TG 31 to the TG 41. In a conventional case, therefore, a further reference voltage propagation delay occurs due to the time constant given by the product of the ON impedance of the TG 41 and the capacitance of the wiring from the TG 31 to the TG 41. As for the analog voltage VA, on the other hand, since the analog switch 50 has a TG (not shown), it is needless to say that a propagation delay of the analog voltage VA occurs due to the wiring delay based on the ON impedance of the TG.

Additionally, in a conventional case, when the gate-to-source voltages Vgs of both the PMOSFETs and NMOSFETs possessed by the TGs (21, 31, 41) fall in the vicinity of ½VDD after the selection of the first reference voltage according to the one-half comparison method, the conduction current flows of the TGs (21, 31, 41), in particular, become smaller, with increase in ON impedance (see a point A shown in FIG. 5), rendering the above-described reference voltage propagation delay prominent.

Hence, in the present invention, for the TGs 21, 31 and 41 and the TG (not shown) of the analog switch 50, the voltage level—a voltage level applied to an NMOSFET gate electrode ("second electrode") at the time of bringing the NMOSFET into conduction—is stepped up via a step-up circuit (described later) to become higher than a value ("second voltage") obtained by subtracting the PMOSFET voltage drop from the supply voltage VDD. That is, the voltage level—a level applied to the NMOSFET gate electrodes of the TGs (21, 31, 41, etc.)—is brought higher than the supply voltage VDD used as the operating voltage of the series resistor 10, the comparator 70 and so on.

Figure 5:
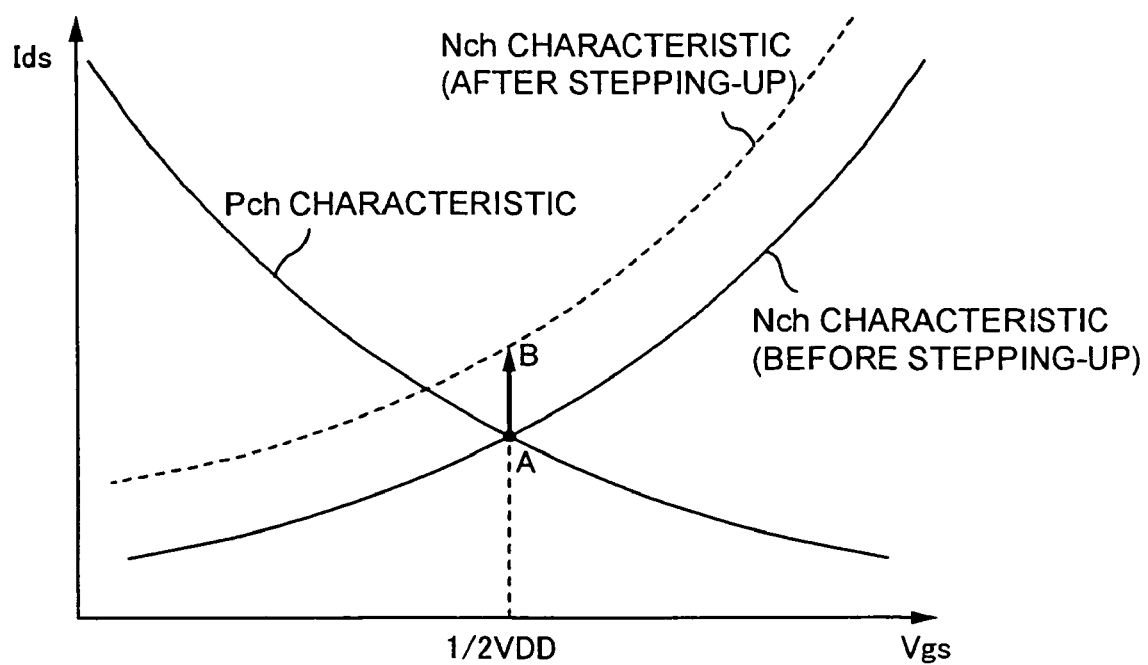
FIG. 5 is a view describing characteristic changes when the gate voltage of an NMOSFET is stepped up.

This allows more NMOSFET drain-to-source current to flow in the TGs (21, 31, 41) than without the stepping-up of voltage as shown in FIG. 5, reducing the ON impedance particularly in the vicinity of the supply voltage ½VDD (see a point B shown in FIG. 5). As a result, the reference voltage propagation delay is improved, thereby improving the AD conversion accuracy. As for the TG (not shown) of the analog switch 50, it is needless to say that the propagation delay of the analog voltage VA is improved by stepping up the voltage level applied to the NMOSFET gate electrode at the time of bringing the NMOSFET into conduction.

Further, in the present invention, as for the TGs 21, 31 and 41 and the TG (not shown) of the analog switch 50, the voltage level of control voltages /A, /B, /C and /D—a level applied to the PMOSFET gate electrode ("first electrode") at the time of bringing the PMOSFET into conduction—is stepped down via a step-down circuit to be lower than the value ("first voltage") obtained by adding the NMOSFET voltage drop to the ground potential GND. That is, the control voltages /A, /B, /C and /D are lower in level than the ground potential GND of the series resistor 10, the comparator 70 and so on.

This allows more PMOSFET drain-to-source current to flow than without the stepping-down of voltage as in the case of stepping up the voltage level applied to the NMOSFET gate electrode at the time of bringing the NMOSFET into conduction, producing an ON impedance reduction effect in the vicinity of the supply voltage ½VDD.

It is to be noted that while in the present invention, only one of the voltage level applied to the NMOSFET gate electrode at the time of bringing the NMOSFET into conduction being stepped up and the voltage level applied to the PMOSFET gate electrode at the time of bringing the PMOSFET into conduction being stepped down may be implemented as a matter of course, implementing the both produces a synergetic effect.

2. First Configuration Example of TG and Peripheral Circuitry Thereof

Figure 2:
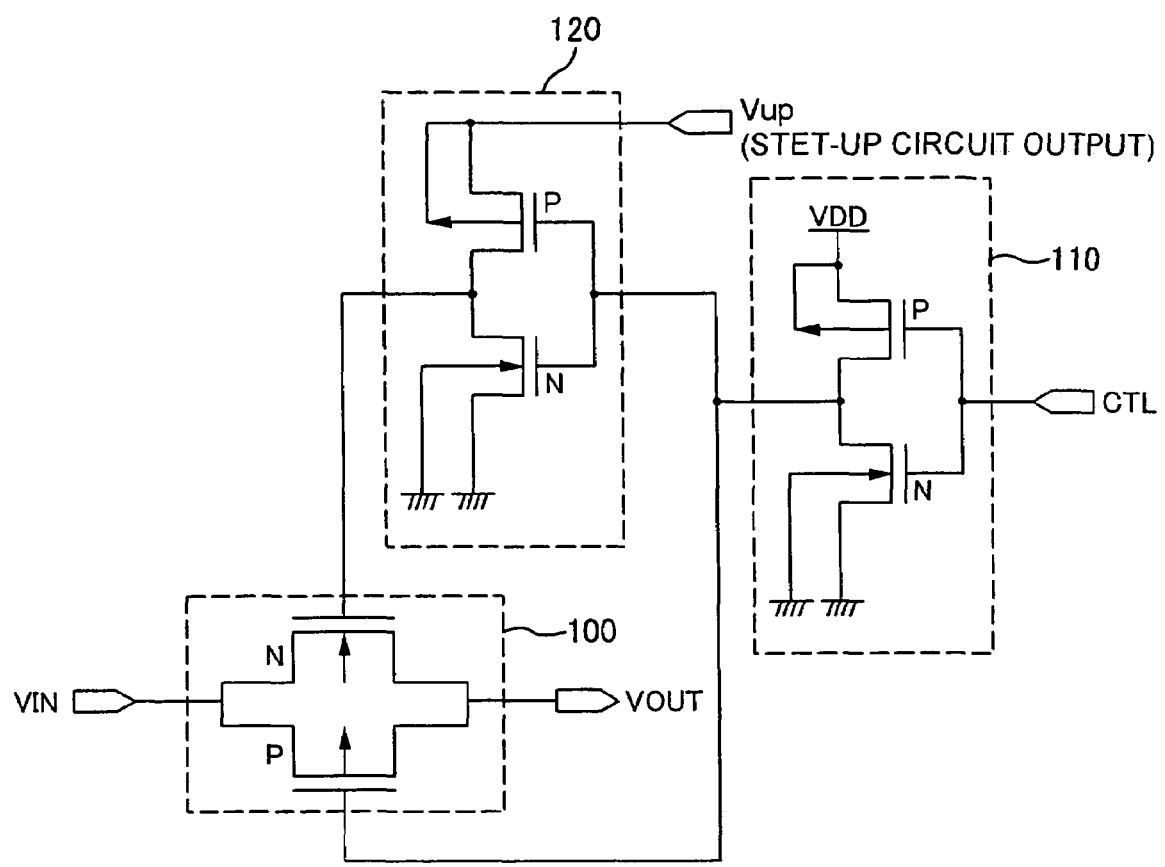
FIG. 2 is a view showing a configuration of a TG and peripheral circuitry thereof according to the embodiment of the invention.

FIG. 2 is a view showing a configuration example of the TG and the peripheral circuitry thereof according to the present invention. In the example shown in this figure, we assume that logics are incorporated in the peripheral circuitry of a TG 100 such that when a control voltage CTL indicates a logic value of "1", the TG 100 is conductive, whereas when the control voltage CTL indicates a logic value of "0", the TG 100 is non-conductive.

The TG 100, constituted by a parallel combination of a PMOSFET and an NMOSFET, is equivalent to the TGs 21, 31 and 41 and the TG (not shown) of the analog switch 50 shown in FIG. 1.

An inverter ("first inverter" of claim 2) 110 is equivalent to the inverters 22, 32 and 42 and the inverter (not shown) possessed by the analog switch 50. The inverter 110 is constituted by a series combination of a PMOSFET and an NMOSFET. When the inverter 110 receives the control voltage CTL, its output, an inverted signal in logic level (polarity) from this input, is applied to the PMOSFET gate electrode of the TG 100. It is to be noted that since the inverter 110 operates at the normal supply voltage VDD, the voltage level of the output having a logic value of "1" is at the supply voltage VDD.

An inverter ("second inverter" of claim 2) 120 is equivalent to the inverters 23, 33 and 43 and the inverter (not shown) of the analog switch 50. The inverter 120 is constituted by a series combination of a PMOSFET and an NMOSFET. When the inverter 120 receives the output of the inverter 110, its output, an inverted signal in logic level (polarity) from this input, is applied to the NMOSFET gate electrode of the TG 100.

In contrast, the positive polarity side of the PMOSFET possessed by the inverter 120 is connected to an output Vup of the step-up circuit stepped up higher than the normal supply voltage VDD. Therefore, when the inverter 120 outputs a logic value of "1", the voltage level of its output is at the output Vup ("fourth voltage") of the step-up circuit if the PMOSFET voltage drop is ignored.

The above is a configuration for stepping up the voltage level applied to the NMOSFET gate electrode when bringing the NMOSFET into conduction. To step down the voltage level applied to the PMOSFET gate electrode at the time of bringing the PMOSFET into conduction, it suffices to change the voltage level at the negative polarity side of the inverter 110. More specifically, the negative polarity side of the NMOSFET possessed by the inverter 110 is connected to an output ("third voltage") of the step-down circuit stepped down lower than the ground potential GND.

3. Second Configuration Example of TG and Peripheral Circuitry Thereof

Figure 3:
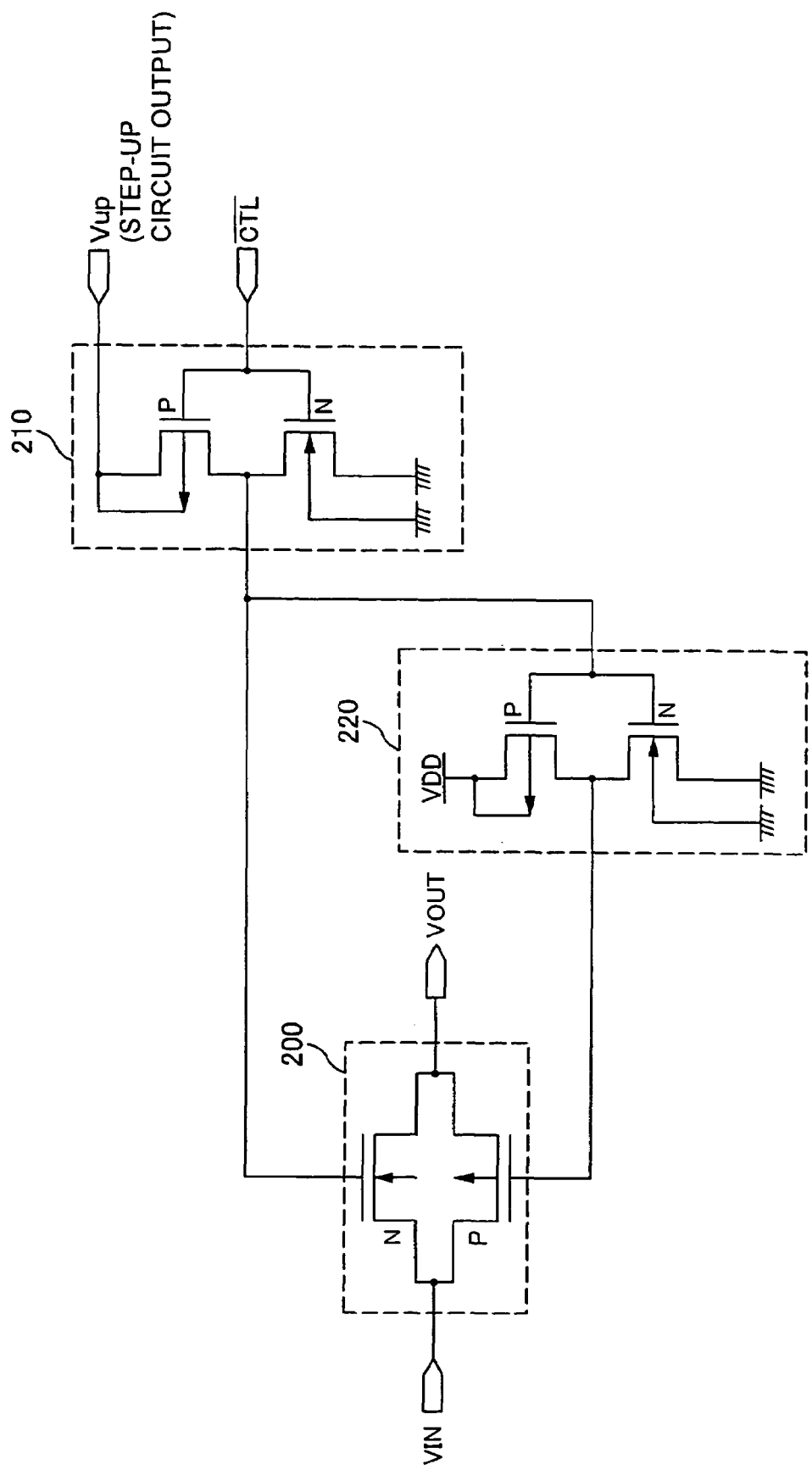
FIG. 3 is a view showing a configuration example of a step-up circuit according to the embodiment of the invention.

FIG. 3 is a view showing another configuration example of the TG and the peripheral circuitry thereof according to the present invention. In the example shown in this figure, we assume that logics are incorporated in the peripheral circuitry of the TG 100 such that when the control voltage CTL indicates a logic value of "1", the TG 100 is conductive, whereas when the control voltage CTL indicates a logic value of "0", the TG 100 is non-conductive. For this reason, this circuitry differs in configuration from the peripheral circuitry of the TGs (21, 31, 41, 100, etc.) shown in FIGS. 1 and 2.

A TG 200 is similar to the TG 100 shown in FIG. 2.

An inverter ("first inverter" in claim 3) 210 is constituted by a series combination of a PMOSFET and an NMOSFET. When the inverter 210 receives a control voltage /CTL, its output, an inverted signal in logic level from this input, is applied to the NMOSFET gate electrode of the TG 200. It is to be noted that the terminal on the positive polarity side of the PMOSFET of the inverter 210 is connected to the output Vup of the step-up circuit stepped up higher than the normal supply voltage VDD. Therefore, when the inverter 210 outputs a logic value of "1", the voltage level of the output is at the output Vup ("fourth voltage") of the step-up circuit if the PMOSFET voltage drop is ignored.

An inverter ("second inverter" in claim 3) 220 is constituted by a series combination of a PMOSFET and an NMOSFET. When the inverter 220 receives the output of the inverter 210, its output, an inverted signal in logic level from this input, is applied to the PMOSFET gate electrode of the TG 200. It is to be noted that the inverter 220 operates at the normal supply voltage VDD. For this reason, even when the inverter 220 receives the stepped-up output Vup of the step-up circuit from the inverter 210, the voltage level of the output having a logic value of "1" is at the supply voltage VDD since the inverter 220 operates at the normal supply voltage VDD.

The above is a configuration for stepping up the voltage level applied to the NMOSFET gate electrode when bringing the NMOSFET into conduction. To step down the voltage level applied to the PMOSFET gate electrode at the time of bringing the PMOSFET into conduction, it suffices to change the voltage level at the negative polarity side of the inverter 220. Specifically, the negative polarity side of the NMOSFET of the inverter 220 is connected to the output ("third voltage") of the step-down circuit stepped down lower than the ground potential GND.

C. Step-Up Circuit Configuration

Figure 4:
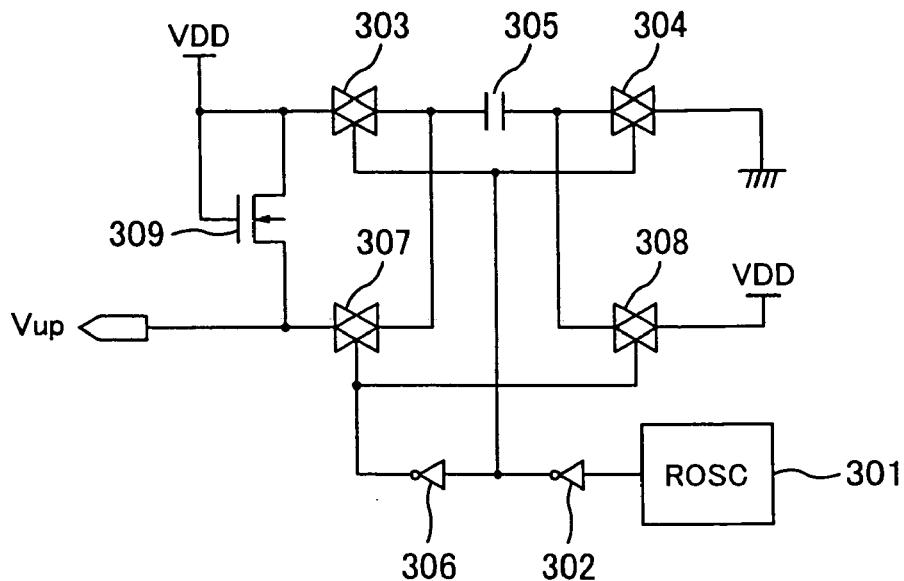
FIG. 4 is a view showing another configuration example of the step-up circuit according to the embodiment of the invention.

FIG. 4 is a view showing a configuration of the step-up circuit according to the embodiment of the present invention.

The step-up circuit shown in the figure has a ring oscillator 301, inverters (302, 306), analog switches (303, 304, 307, 308), a capacitive element 305 and an analog switch 309.

The ring oscillator 301 is an oscillating circuit for generating a pulse signal such as a clock signal by forming a looped circuit with a plurality of inverters connected in series. It is to be noted that a CR oscillator or a crystal oscillator may be used in place of the ring oscillator 301.

The inverter 302 may be provided depending on the logic (positive or negative logic) of the analog switches 303 and 304. Similarly, the inverter 306 is provided depending on the logic (positive or negative logic) of the analog switches 307 and 308. It is to be noted that positive logic is used in the description below for the analog switches (303, 304, 307, 308) hereinafter.

The analog switch ("first switching element") 303 is connected to the supply voltage VDD ("second voltage") at one terminal and to the terminal on the supply voltage VDD side of the capacitive element 305 at the other terminal. And the analog switch ("second switching element") 304 is connected to the terminal on the ground potential GND side of the capacitive element 305 at one terminal and to the ground potential GND ("first voltage") at the other terminal.

Here, when the output of the ring oscillator 301 is at a logic value of "0", a logic value of "1" from the inverter 302 inverting the output is input to the analog switches 303 and 304, bringing both the analog switches 303 and 304 into conduction. It is to be noted that the analog switches 307 and 308 are non-conductive because these switches receives a logic value of "0" via the inverter 306. At this time, the capacitive element 305 is charged first time round, thereby causing the voltage level of the terminal on the analog switch 303 side of the capacitive element 305 to be at the supply voltage VDD and that of the terminal on the analog switch 304 side to be at the ground potential GND.

The analog switch ("third switching element") 307 is connected to the output terminal of the step-up circuit at one terminal and to the terminal on the supply voltage VDD side of the capacitive element 305 at the other terminal. And the analog switch ("fourth switching element") 308 is connected to the terminal on the ground potential GND side of the capacitive element 305 at one terminal and to the supply voltage VDD at the other terminal.

Here, when the output of the ring oscillator 301 changes from a logic value of "0" to "1", a logic value of "1", the same as the output of the ring oscillator 301, is input to the analog switches 307 and 308 via the inverters 302 and 306. This brings about a transition from nonconduction to conduction of the analog switches 307 and 308. Meanwhile, the analog switches 303 and 304 receive a logic value of "0", bringing about a transition from conduction to nonconduction and allowing the capacitive element 305 to be charged second time round. At this second charge, the voltage level of the terminal on the analog switch 308 side of the capacitive element 305 is at the supply voltage VDD. Meanwhile, the voltage level of the terminal on the analog switch 307 side of the capacitive element 305 is twice the supply voltage VDD as a result of a shift by the potential difference of VDD between the terminals of the capacitive element 305 at the first charge.

That is, after the second charge, the step-up circuit inputs, as the stepped-up supply voltage, twice the supply voltage VDD, generated at the terminal on the analog switch 307 side of the capacitive element 305, to the terminal on the PMOSFET side of the inverter 120 shown in FIG. 2 and the terminal on the PMOSFET side of the inverter 210 shown in FIG. 3 via the output terminal Vup.

The analog switch ("fifth switching element") 309 is connected to the terminal on the supply voltage VDD side of the analog switch 303 at one terminal and to the terminal on the supply voltage VDD side of the analog switch 307 at the other terminal, with the supply voltage VDD applied directly to the gate electrode thereof. Therefore, until the second charge of the capacitive element 305, the gate-to-source voltages Vgs is at the supply voltage VDD, allowing the analog switch 309 to be conductive. At the time of the second charge of the capacitive element 305, in contrast, the gate-to-source voltage Vgs becomes "–VDD", a negative value, switching the analog switch 309 into nonconduction. That is, as a result of providing the analog switch 309, the voltage level of the output terminal Vup is kept from becoming unstable initially prior to the first charge of the capacitive element 305, and thus a stable output equal to the supply voltage VDD is supplied.

While description has been given above of the present embodiment, the embodiment is given to facilitate the understanding of the present invention and is not to be considered as restrictive. The present invention may be modified or improved upon without departing from the scope of the invention and includes equivalents thereof.

For example, while in the aforementioned embodiment, a case has been described where the present invention is applied to a successive comparison type AD converter, similar effects—reduced TG ON impedance and improved AD conversion accuracy as a result thereof—can be obtained by applying the present invention to batch comparison type and other types of AD converters.

Although exemplary embodiments of the invention have been shown and described, it will be apparent to those having ordinary skill in the art that a number of changes, modifications, or alterations to the invention as described herein may be made, none of which depart from the spirit of the invention. All such changes, modifications and alterations should therefore be seen as within the scope of the invention.

It is claimed:

1. An AD converter having resistors arranged in series to generate at each of a connection point for each resistor a reference voltage to convert an analog value to a digital value, and semiconductor switches each constituted by a parallel combination of a PMOSFET and an NMOSFET, the parallel combination disposed one for each of the connection points, the AD converter, while applying a first voltage to a first gate electrode of the PMOSFET to bring the PMOSFET into conduction and a second voltage higher than the first voltage to a second gate electrode of the NMOSFET to bring the NMOSFET into conduction, generating the digital value on the basis of results of comparing the analog value with the reference voltages output from the semiconductor switches, the AD converter comprising:

a control circuit operable at least either to step down the first voltage applied to the first gate electrode or to step up the second voltage applied to the second gate electrode.

2. The AD converter according to claim 1, wherein the control circuit includes:

a first inverter having inputted thereto a control voltage to bring the semiconductor switch into conduction, the first inverter applying an output, an inverted signal in polarity from the input, to the first gate electrode;

a second inverter having inputted thereto the output of the first inverter, the second inverter applying an output, an inverted signal in polarity from the input, to the second gate electrode; and at least one of a step-down circuit to apply a third voltage, stepped down from the first voltage, to a negative polarity side of the first inverter and a step-up circuit to apply a fourth voltage, stepped up from the second voltage, to a positive polarity side of the second inverter.

3. The AD converter according to claim 1, wherein the control circuit includes:

a first inverter having inputted thereto a control voltage to bring the semiconductor switch into conduction, the first inverter applying an output, an inverted signal in polarity from the input, to the second gate electrode;

a second inverter having inputted thereto the output of the first inverter, the second inverter applying an output, an inverted signal in polarity from the input, to the first gate electrode; and at least one of a step-down circuit to apply a third voltage, stepped down from the first voltage, to a negative polarity side of the second inverter and a step-up circuit to apply a fourth voltage, stepped up from the second voltage, to a positive polarity side of the first inverter.

4. The AD converter according to claim 2, wherein the step-up circuit includes:

a capacitive element;

a first switching element having one terminal to have the second voltage inputted, the other terminal being connect with one terminal of the capacitive element, and a control electrode to have inputted thereto a control signal changing between one level and the other level, the first switching element being conductive when the control signal is at the one level;

a second switching element having one terminal being connected with the other terminal of the capacitive element, the other terminal to have the first voltage inputted, and a control electrode to have the control signal inputted, the second switching element being conductive when the control signal is at the one level;

a third switching element having one terminal connected to an output terminal, the other terminal being connected with the one terminal of the capacitive element, and a control electrode to have the control signal inputted, the third switching element being conductive when the control signal is at the other level;

a fourth switching element having one terminal being connected with the other terminal of the capacitive element, the other terminal to have the second voltage inputted, and a control electrode to have the control signal inputted, the second switching element being conductive when the control signal is at the other level; and a fifth switching element connected between the one terminal of the first switching element and the one terminal of the third switching element, the fifth switching element to render an initial voltage of the output terminal fixed.

5. The AD converter according to claim 1 wherein the AD converter is of a successive comparison type that generates the digital value on the basis of results of successively comparing the analog value with as many selected reference voltages as a bit count of the digital value.

6. An AD converter having resistors arranged in series to generate at each of a connection point for each resistor a reference voltage to convert an analog value to a digital value, and first semiconductor switches each constituted by a parallel combination of a first PMOSFET and a first NMOSFET, the parallel combination disposed one for each of the connection points, the AD converter, while applying a first voltage to a first gate electrode of the first PMOSFET to bring the first PMOSFET into conduction and a second voltage higher than the first voltage to a second gate electrode of the first NMOSFET to bring the first NMOSFET into conduction, generating the digital value on the basis of results of successively comparing the analog value with as many reference voltages output from the first semiconductor switches as a bit count of the digital value, the AD converter comprising:

a first switch cluster having as many of the first semiconductor switches as the number of the connection points, the first switch cluster being divided into groups, first semiconductor switches of each of which are simultaneously brought into conduction/nonconduction;

a second switch cluster having as many second semiconductor switches, each constituted by a parallel combination of a second PMOSFET and a second NMOSFET, as the largest number among the numbers of first semiconductor switches of the respective groups, the second semiconductor switches having inputted in parallel thereto outputs of the first semiconductor switches of one of the groups upon each of the comparisons, one of the second semiconductor switches outputting the corresponding input upon each comparison when applying the first voltage to a third gate electrode of the second PMOSFET to bring the second PMOSFET into conduction and the second voltage to a fourth gate electrode of the second NMOSFET to bring the second NMOSFET into conduction;

a comparator to compare the analog value with the output of the one of the second semiconductor switches;

an encoder to sequentially generate bits of the digital value on the basis of the output of the comparator;

a first control circuit operable at least either to step down the first voltage applied to the first gate electrode or to step up the second voltage applied to the second gate electrode; and a second control circuit operable at least either to step down the first voltage applied to the third gate electrode or to step up the second voltage applied to the fourth gate electrode.

7. The AD converter according to claim 6, further comprising:

a third semiconductor switch constituted by a parallel combination of a third PMOSFET and a third NMOSFET, the third semiconductor switch having inputted thereto the output of the one of the second semiconductor switches and, when applying the first voltage to a fifth gate electrode of the third PMOSFET to bring the third PMOSFET into conduction and the second voltage to a sixth gate electrode of the third NMOSFET to bring the third NMOSFET into conduction, outputting the input;

a fourth semiconductor switch constituted by a parallel combination of a fourth PMOSFET and a fourth NMOSFET, the fourth semiconductor switch having the analog value inputted thereto and, when applying the first voltage to a seventh gate electrode of the fourth PMOSFET to bring the fourth PMOSFET into conduction and applying the second voltage to an eighth gate electrode of the fourth NMOSFET to bring the fourth NMOSFET into conduction, outputting the input;

a capacitive element having one terminal to have inputted thereto alternately the outputs of the third and fourth semiconductor switches, the capacitive element providing a voltage level of the other terminal as input to the comparator;

a third control circuit operable at least either to step down the first voltage applied to the fifth gate electrode or to step up the second voltage applied to the sixth gate electrode; and a fourth control circuit operable at least either to step down the first voltage applied to the seventh gate electrode or to step up the second voltage applied to the eighth gate electrode.

8. The AD converter according to claim 6, wherein the series resistor is folded back a predetermined number of times and wired.

* * * * *